United States Patent
Korbler et al.

(10) Patent No.: US 9,987,666 B2
(45) Date of Patent: Jun. 5, 2018

(54) COMPOSITE TRANSDUCER APPARATUS AND SYSTEM FOR PROCESSING A SUBSTRATE AND METHOD OF CONSTRUCTING THE SAME

(71) Applicant: Akrion Systems, LLC, Allentown, PA (US)

(72) Inventors: John A. Korbler, Mertztown, PA (US); Richard Novak, Plymouth, MN (US)

(73) Assignee: NAURA AKRION INC.

( * ) Notice: Subject to any disclaimer, the term of this patent is extended or adjusted under 35 U.S.C. 154(b) by 0 days. days.

(21) Appl. No.: 14/727,116

(22) Filed: Jun. 1, 2015

(65) Prior Publication Data
US 2015/0258583 A1    Sep. 17, 2015

Related U.S. Application Data

(63) Continuation of application No. 14/281,829, filed on May 19, 2014, now Pat. No. 9,049,520, which is a continuation-in-part of application No. 13/633,662, filed on Oct. 2, 2012, which is a continuation of application No. 12/266,543, filed on Nov. 6, 2008, now Pat. No. 8,279,712.
(Continued)

(51) Int. Cl.
| | |
|---|---|
| *B08B 3/12* | (2006.01) |
| *B06B 1/06* | (2006.01) |
| *H04R 17/00* | (2006.01) |
| *H01L 41/37* | (2013.01) |
| *H01L 41/18* | (2006.01) |

(52) U.S. Cl.
CPC .............. *B08B 3/12* (2013.01); *B06B 1/0607* (2013.01); *B06B 1/0629* (2013.01); *B06B 1/0633* (2013.01); *H01L 41/183* (2013.01); *H01L 41/37* (2013.01); *H04R 17/00* (2013.01); *B06B 2201/55* (2013.01); *B06B 2201/70* (2013.01); *B06B 2201/71* (2013.01)

(58) Field of Classification Search
CPC .............. B06B 1/0629; B06B 2201/71; B06B 2201/70; B06B 1/0633; B06B 1/0607; B06B 2201/55; B08B 3/12; H01L 41/37; H01L 41/183; H04R 17/00
See application file for complete search history.

(56) References Cited

U.S. PATENT DOCUMENTS

| | | |
|---|---|---|
| 3,260,991 A | 7/1966 | Laakmann et al. |
| 4,672,591 A | 6/1987 | Breimesser et al. |
| (Continued) | | |

FOREIGN PATENT DOCUMENTS

| | | |
|---|---|---|
| CN | 1289212 | 3/2001 |
| WO | 8100078 | 1/1981 |
| WO | 2009061970 | 5/2009 |

*Primary Examiner* — Alexander Markoff
(74) *Attorney, Agent, or Firm* — The Belles Group, P.C.

(57) ABSTRACT

An apparatus for processing articles with acoustic energy and a method of constructing a transducer that utilizes a composite of piezoelectric pillars. In one embodiment, the invention is a method of constructing a device for generating acoustic energy comprising: providing a layer of supporting material; positioning a piezoelectric material atop the layer of adhesive material; cutting the piezoelectric material into a plurality of pillars so that spaces exist between adjacent pillars; and filling the spaces with a resilient material to form a composite assembly.

15 Claims, 13 Drawing Sheets

Related U.S. Application Data

(60) Provisional application No. 61/034,142, filed on Mar. 5, 2008, provisional application No. 60/985,947, filed on Nov. 6, 2007.

(56) References Cited

U.S. PATENT DOCUMENTS

| | | |
|---|---|---|
| 5,037,481 A | 8/1991 | Bran |
| 5,090,432 A | 2/1992 | Bran |
| 5,286,657 A | 2/1994 | Bran |
| 5,317,618 A | 5/1994 | Nakahara et al. |
| 5,556,479 A | 9/1996 | Bran |
| 5,629,578 A | 5/1997 | Winzer et al. |
| 5,648,942 A | 7/1997 | Kunkel, III |
| 5,792,058 A | 8/1998 | Lee et al. |
| 6,039,059 A | 3/2000 | Bran |
| 6,122,837 A | 9/2000 | Olesen |
| 6,140,744 A | 10/2000 | Bran |
| 6,295,999 B1 | 10/2001 | Bran |
| 6,378,534 B1 | 4/2002 | Olesen et al. |
| 6,463,938 B2 | 10/2002 | Bran |
| 6,539,952 B2 | 4/2003 | Itzkowitz |
| 6,539,962 B2 | 4/2003 | Paper et al. |
| 6,679,272 B2 | 1/2004 | Bran et al. |
| 6,681,782 B2 | 1/2004 | Bran |
| 6,684,891 B2 | 2/2004 | Bran |
| 6,699,111 B2 | 3/2004 | Legner et al. |
| 6,732,749 B2 | 5/2004 | Myland |
| 6,754,980 B2 | 6/2004 | Lauerhaas et al. |
| 6,755,352 B1 | 6/2004 | Toda |
| 6,758,094 B2 | 7/2004 | Miller |
| 6,799,583 B2 | 10/2004 | Puri et al. |
| 6,843,855 B2 | 1/2005 | Verhaverbeke |
| 6,859,984 B2 | 3/2005 | Dinet et al. |
| 6,866,051 B1 | 3/2005 | Nickhou et al. |
| 6,904,921 B2 | 6/2005 | Beck et al. |
| 6,946,774 B2 | 9/2005 | Beck et al. |
| 6,951,042 B1 | 10/2005 | Mikhaylichenko et al. |
| 6,955,727 B2 | 10/2005 | Korbler et al. |
| 7,100,304 B2 | 9/2006 | Lauerhaas et al. |
| 7,145,286 B2 | 12/2006 | Beck et al. |
| 7,784,478 B2 | 8/2010 | Fani et al. |
| 8,279,712 B2 | 10/2012 | Korbler et al. |
| 8,316,869 B2 | 11/2012 | Fani et al. |
| 9,049,520 B2 * | 6/2015 | Korbler ............... B06B 1/0629 |
| 2002/0029788 A1 | 3/2002 | Verhaverbeke et al. |
| 2002/0185152 A1 | 12/2002 | Lauerhaas et al. |
| 2003/0192571 A1 | 10/2003 | Yeo et al. |
| 2004/0069319 A1 | 4/2004 | Boyd et al. |
| 2004/0113524 A1 | 6/2004 | Baumgartner et al. |
| 2004/0132318 A1 | 7/2004 | Kim et al. |
| 2004/0168706 A1 | 9/2004 | Boyd et al. |
| 2005/0003737 A1 | 1/2005 | Montierth et al. |
| 2005/0145267 A1 | 7/2005 | Korolik et al. |
| 2005/0199277 A1 | 9/2005 | Scranton |
| 2005/0221038 A1 | 10/2005 | Park |
| 2005/0252522 A1 | 11/2005 | Struven et al. |
| 2006/0235300 A1 | 10/2006 | Weng et al. |
| 2006/0278253 A1 | 12/2006 | Verhaverbeke |
| 2007/0169800 A1 | 7/2007 | Fani et al. |
| 2007/0170812 A1 | 7/2007 | Fani et al. |
| 2009/0231959 A1 | 9/2009 | Korbler et al. |
| 2013/0333723 A1 | 12/2013 | Fani et al. |
| 2014/0216508 A1 | 8/2014 | Korbler |

* cited by examiner

COMPOSITE TRANSDUCER APPARATUS AND SYSTEM FOR PROCESSING A SUBSTRATE AND METHOD OF CONSTRUCTING THE SAME

CROSS-REFERENCE TO RELATED PATENT APPLICATIONS

The present patent application is a continuation of U.S. patent application Ser. No. 14/281,829, filed May 19, 2014, which is a continuation-in-part of U.S. patent application Ser. No. 13/633,662, filed Oct. 2, 2012, which is a continuation of U.S. patent application Ser. No. 12/266,543, filed Nov. 6, 2008, now issued as U.S. Pat. No. 8,279,712, which in turn claims the benefit of U.S. Provisional Patent Application Ser. No. 60/985,947, filed Nov. 6, 2007 and U.S. Provisional Patent Application Ser. No. 61/034,142, filed Mar. 5, 2008, the entireties of which are hereby incorporated by reference.

FIELD OF THE INVENTION

The present invention relates generally to an apparatus and system for generating acoustic energy for the processing of substrates, such as semiconductor wafers, raw silicon substrates, flat panel displays, solar panels, photomasks, discs, magnetic heads or any other item that requires a high level of processing precision. Specifically, the invention relates to an acoustic generating apparatus, or a system incorporating the same, that can provide high levels of particle removal efficiency from substrates containing delicate devices that minimizes damage to the delicate devices.

BACKGROUND OF THE INVENTION

In the field of semiconductor manufacturing, it has been recognized since the beginning of the industry that removing particles from semiconductor wafers during the manufacturing process is a critical requirement to producing quality profitable wafers. While many different systems and methods have been developed over the years to remove particles from semiconductor wafers, many of these systems and methods are undesirable because they cause damage to the wafers. Thus, the removal of particles from wafers must be balanced against the amount of damage caused to the wafers by the cleaning method and/or system. It is therefore desirable for a cleaning method or system to be able to break particles free from the delicate semiconductor wafer without resulting in damage to the device structure.

Existing techniques for freeing the particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer. This etching process, known as undercutting, reduces the physical contact area to which the particle binds to the surface, thus facilitating removal. However, a mechanical process is still required to actually remove the particle from the wafer surface.

For larger particles and for larger devices, scrubbers have been used to physically brush the particle off the surface of the wafer. However, as device sizes shrank in size, scrubbers and other forms of physical cleaners became inadequate because their physical contact with the wafers cause catastrophic damage to smaller devices.

The application of acoustic energy during wet processing has gained widespread acceptance to effectuate particle removal, especially to clean sub-micron particles off wafers (or plates) undergoing fabrication in the semiconductor process line. The acoustic energy used in substrate processing is generated via a source of acoustic energy. Typically, this source of sonic energy comprises a transducer which is made of piezoelectric material, such as a ceramic or crystal. In operation, the transducer is coupled to a source of electrical energy. An electrical energy signal (i.e. electricity) is supplied to the transducer. The transducer converts this electrical energy signal into vibrational mechanical energy (i.e. acoustic energy) which is then transmitted to the substrates being processed. The transmission of the acoustic energy from the transducer to the substrates is typically accomplished by a fluid that acoustically couples the transducer to the substrate. It is also typical that a material capable of acoustic energy transmission be positioned between the transducer itself and the fluid coupling layer to avoid "shorting" of the electrical contacts on the piezoelectric material. This transmitting material can take on a wide variety of structural arrangements, including a thin layer, a rigid plate, a rod-like probe, a lens, etc. The transmitting material is usually produced of a material that is inert with respect to the fluid coupling layer to avoid contamination of the substrate.

The application of acoustic energy to substrates has proven to be a very effective way to remove particles and to improve the efficiency of other process steps, but as with any mechanical process, damage to the substrates and devices thereon is still possible. Thus, acoustic cleaning of substrates is faced with the same damage issues as traditional physical cleaning.

The acoustic energy generated by existing transducer assemblies is often energetic enough to cause some of the fragile structures that make up the electrical circuit to be damaged (i.e., removed or partially removed causing the circuit to no longer function). Through long-term study of existing transducer assemblies and the associated acoustic properties, the current inventors have determined that a myriad of problems exist both with the structure of the piezoelectric material and the direction and orientation of the acoustic waves propagated by existing transducer assemblies.

SUMMARY OF THE INVENTION

It is therefore an object of the present invention to provide a system and method of cleaning substrates using sonic energy.

Another object of the present invention is to provide a system and method of processing substrates using sonic energy that reduces damage to devices on the substrates.

Still another object of the present invention is to provide a system and method of cleaning substrates using sonic energy that reduces damage to devices on the substrates while achieving suitable particle removal efficiency.

Yet another object of the present invention is to provide a system and method of processing substrates using sonic energy that controls cavitation within the processing fluid.

A yet further object of the present invention is to provide a system and method for processing substrates that results in less energy loss between the transducer and the substrate to be processed.

Another object of the present invention is to provide a system and method for processing substrates that results in a more uniform energy distribution on the surface of the substrate.

This invention is of an acoustic generation device formed using ceramic piezoelectric material formed into a radial section and segmented such that it is composed of individual acoustic generating pillars that can be interconnected to generate an acoustic wave that efficiently and precisely couples into a fluid acoustic transmission media applied to either the front and/or the back of a wafer. The radial nature of the piezoelectric element is designed so that the acoustic energy is directed into the acoustical transmission fluid and on to the wafer (or plate) surface and reflects away from the generating source, suppressing standing waves which contain nodes of very high energy and very low energy. The high energy regions can lead to structure damage and the low energy regions can lead to reduced removal of particles. Both these conditions are unwanted in the use of these transducers.

In one aspect, the invention can be an apparatus for generating acoustic energy comprising: a plurality of pillars constructed of a piezoelectric material, the pillars arranged in a spaced-apart manner so that spaces exist between adjacent pillars; the pillars having a width and a height extending between a top surface and a bottom surface, wherein the height of the pillars is greater than the width of the pillars; and the spaces filled with a resilient material so as to form a composite assembly.

In another aspect, the invention is an apparatus for processing articles with acoustic energy comprising: a transducer assembly comprising: a transmitting structure having a concave inner surface and a convex outer surface; a first transducer having a convex bottom surface bonded to the concave inner surface of the transmitting structure; a second transducer having a convex bottom surface bonded to the concave inner surface of the transmitting structure, the second active transducer spaced from the first active transducer so that a non-active acoustic energy area exists on the transmitting structure between the first and second transducers.

In yet another aspect, the invention is a method of constructing a device for generating acoustic energy comprising: providing a layer of supporting material; positioning a piezoelectric material atop the layer of adhesive material; cutting the piezoelectric material into a plurality of pillars so that spaces exist between adjacent pillars; and filling the spaces with a resilient material to form a composite assembly.

In a further aspect, the invention can be a method of processing an article comprising: supporting an article on a support; providing a transducer assembly comprising a transmitting structure having a concave inner surface and a convex outer surface; a first transducer having a convex bottom surface bonded to the concave inner surface of the transmitting structure; a second transducer having a convex bottom surface bonded to the concave inner surface of the transmitting structure, the second active transducer spaced from the first active transducer so that a non-active acoustic energy area exists on the transmitting structure between the first and second transducers; positioning the transducer assembly adjacent to a surface of the article on the support and in an orientation wherein the non-active acoustic area of the transmitting structure faces the surface of the article; applying fluid to the surface of the article so that the convex bottom surface of the transmitting structure is fluidly coupled to the surface of the article; and activating the first and/or second transducers, thereby generating acoustic are propagated at the surface of the article at a non-normal angle that results in reflected acoustic waves travelling away from the transducer assembly.

DETAILED DESCRIPTION OF THE DRAWINGS

Figure 1:
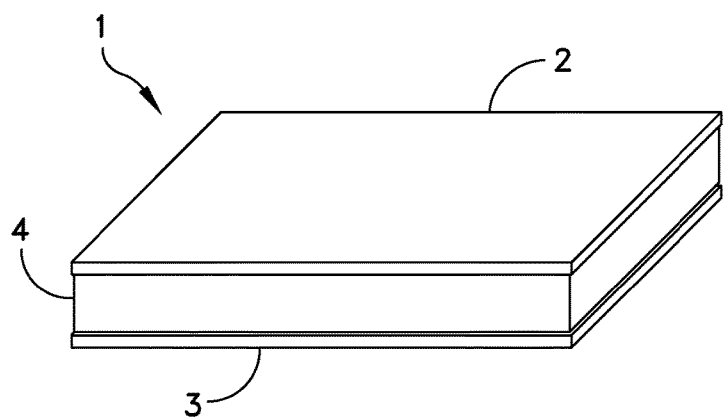
FIG. 1 is a schematic of a prior art transducer.
Figure 2:
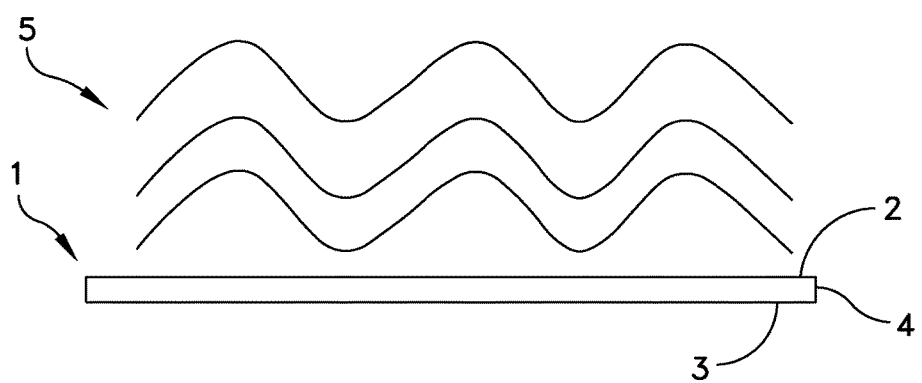
FIG. 2 is a schematic illustrating an acoustic wave generated by the prior art transducer of FIG. 1 having nodes and antinodes.

Referring to FIG. 1, a typical prior art transducer 1 used in existing acoustic processing systems is illustrated. While the exact shape and orientation of the prior art transducer 1 used in the industry varies, all known prior art transducers 1 are large flat plate structures. It has been discovered that these prior art transducers 1 have an issue in that when they are driven with electrodes 2, 3 on opposite sides the plate and the piezoelectric material 4 is set into oscillation by its inherent piezoelectric effect, the resulting oscillations tend to be multi-nodal depending on the exact shape of the flat plate structure. As can be seen in FIG. 2, this in effect launches a complicated acoustic wave 5. This acoustic wave 5 has a non uniform energy pattern.

In addition, if the transducer 1 is positioned so that its major surfaces are parallel to a substrate to be processed (i.e., the acoustic wave 5 propagates in a direction perpendicular to the surface of the substrate), the acoustic wave 5 reflects off the surface of the wafer and returns toward the transducer 1. This creates a standing wave. In fact, the standing wave problem has been discovered to exist even in transducer arrangements where the acoustic energy wave is transmitted parallel to the surface of the wafer but has a radial component that is normal to the wafer.

A standing wave consists of nodes and antinodes and therefore in terms of energy, subjects the wafer to localized areas of high and low energy points. The wave returning to the transducer 1 dissipates heat into the transducer 1 and consequently requires some form of cooling, either liquid and/or gas. Without cooling, some of the components associated with the construction can be quickly degraded. The impedance of a typical ceramic or crystal piezoelectric material also changes as a function of temperature. If the temperature changes from the temperature at which it was matched to the power supply (fixed match to 50 ohm load) the piezoelectric material dissipates additional energy in the material as heat. This further heats the transducer 1 causing still more changes in impedance. Left unchecked, this will lead to failure of the transducer 1.

Referring now to FIGS. 3A-3F, a composite transducer 100 and its construction at according to one embodiment of the present invention will be described. To begin, a typical flat stock piece of a piezoelectric material is provided (not shown). The piezoelectric material can be a ceramic, crystal or any other material capable of converting electrical energy to mechanical energy. The flat stock piece of piezoelectric material is then placed on a wax base 10 or other supporting material, such as an adhesive. In some embodiment, the supporting material may be an electrode (discussed later). The supporting material can be any material or structure capable of performing the supporting function described below.

Figure 3A:
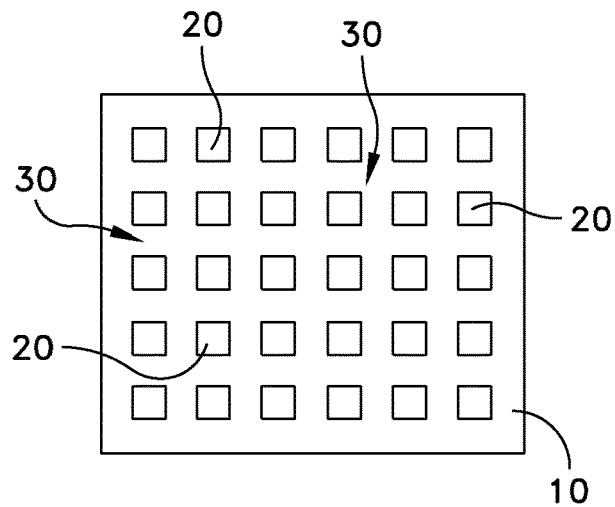
FIG. 3A is a top view of an array of piezoelectric pillars supported on a wax base and used to create a transducer according to one embodiment of the present invention.
Figure 3B:
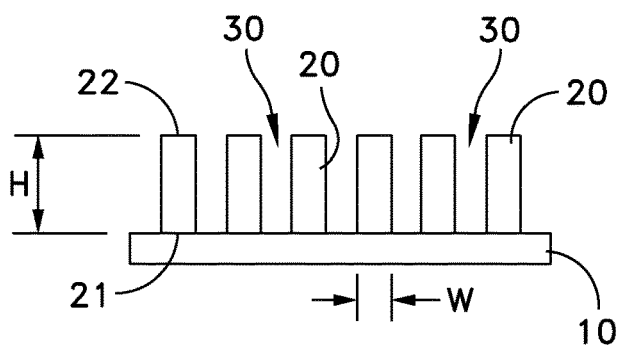
FIG. 3B is a side view of the array of piezoelectric pillars of FIG. 3A.
Figure 3C:
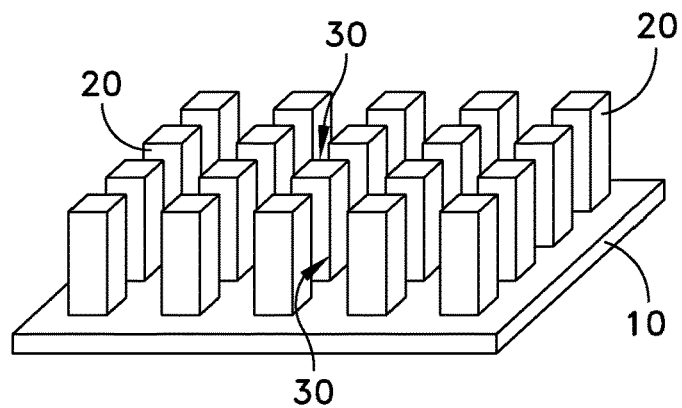
FIG. 3C is a perspective view of the array of piezoelectric pillars of FIG. 3A.

Referring now to FIGS. 3A-3C exclusively, once the flat stock piezoelectric material is placed on the wax base 10, the piezoelectric material is cut into pieces in both x and y planes, thereby forming an array of pillars 20 of the piezoelectric material. During the cutting process the saw preferably cuts only through the flat stock piezoelectric material, and not the wax base 10. The wax base 10 holds the pillars 20 in place in their spaced apart and generally upright orientation. A plurality of intersecting channels are formed between the pillars 20 thereby providing spaces 30 between adjacent pillars 20. While the pillars 20 are in an equally spaced-apart array configuration in the illustrated embodiment, other configurations and geometric patterns can be achieved. Moreover, if desired, the pillars 20 can take on other geometric shapes, including cylindrical, radial segment, etc. In order to avoid clutter, only a few of the pillars 20 and spaces 30 are numerically identified in the drawings.

Each of the pillars 20 has a height H defined by the distance between its bottom surface 21 and its top surface 22. Each of the pillars also has a width W. It is preferable that the height H of the pillars 20 be greater than the width W. It is even more preferred that the height H be twice the width W or greater. It is also preferred that pillar width W and the width of spaces 30 be approximately equal, or at the very least of the same magnitude. In other embodiments, it may be preferred that the width of the spaces 30 be smaller than the width W of the pillars 20.

Moreover, from a functionality standpoint, it is also preferred that the width W of the pillars 20 and the width of the spaces 30 be less than a wavelength of the acoustic energy waves to be generated by the composite transducer 100. For the example, for a pillar 20 operating at a 1 MHz frequency, the preferred dimensions are that the height H of the pillar 20 be approximately 1.6 mm, the width W of the pillar 20 be approximately 0.8 mm or less, and the width of the surrounding spaces 30 be less than or equal to 0.8 mm in the active areas. In other embodiments which are described later, it may be desirable to have not acoustically active areas. There are various means to create active and non-active acoustical generating areas described later.

Figure 3D:
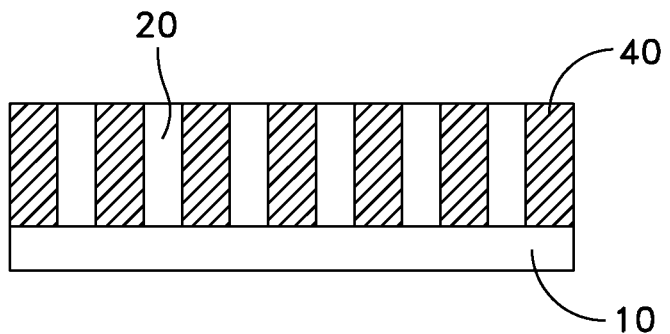
FIG. 3D is a side view of the array of piezoelectric pillars of FIG. 3A with the spaces between pillars filled with a resilient material, according to one embodiment of the present invention.

Referring now to FIG. 3D, once the pillars 20 are created, the spaces 30 are backfilled with a curable filler 40. In one embodiment, the curable filler is preferably a resilient material 40. Other examples of curable fillers include elastomers and epoxies. Once the filler 40 cures, the wax base 10 is removed, thereby resulting in a composite assembly 50 formed by the pillars 20 of piezoelectric elements separated by the filler 40. The composite assembly is shown in FIG. 3E.

Figure 3E:
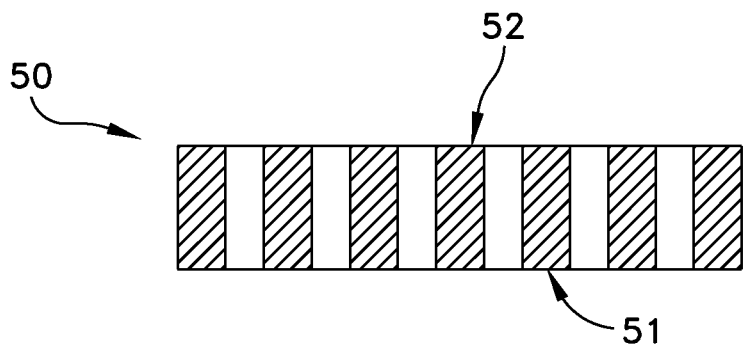
FIG. 3E is a side view of a composite assembly comprising the piezoelectric pillars with the spaces between pillars filled with a resilient material as shown in FIG. 3D, wherein the wax base has been removed, according to one embodiment of the present invention.

Referring now to FIG. 3E, the composite assembly 50 comprises a bottom surface 51 and a top surface 52. As will be described in detail below, the composite assembly 50 can be formed or later shaped so as have curvature.

Figure 3F:
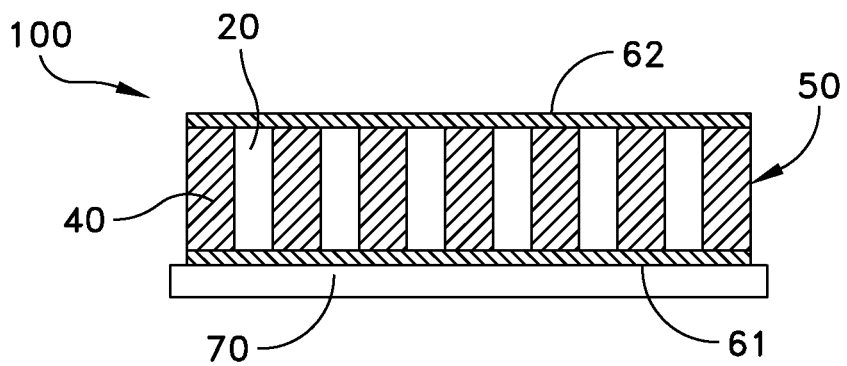
FIG. 3F is a side view of a transducer incorporating the composite assembly of FIG. 3E according to one embodiment of the present invention, wherein a transmitting material is bonded to the bottom electrode.

Referring now to FIG. 3F, once the composite assembly 50 is in the desired shape (which is flat in the illustrated embodiment), an electrically conductive material is applied to the bottom and top surfaces 51, 52 of the composite assembly 50, thereby forming electrodes 61, 62. As a result, a transducer 100 according to one embodiment of the present invention is formed. The electrically conductive material used to form the electrodes 61, 62 can be a metal, such as silver, an electrically conductive epoxy, or any material that can conduct an electric current to excite the piezoelectric pillars 20.

Figure 6:
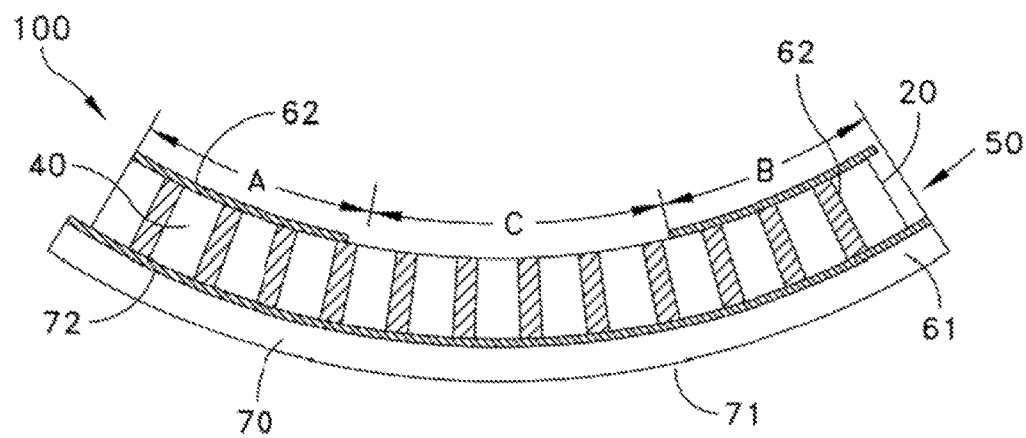
FIG. 6 is a cross-sectional side view of a curved composite transducer according to one embodiment of the present invention.

As will be described in greater detail below, in certain situations it may be desirable to only energize a certain one or subsets of the piezoelectric pillars 20. Thus, while the electrodes 61, 62 are shown as being applied to entirety of the bottom and top surfaces 51, 52 of the composite assembly 50, in other embodiments the electrodes 61, 62 may cover only selected areas that are electrically isolated from one another (as shown in the embodiment of FIG. 6).

When the transducer 100 is to be used in conjunction with the wet processing of articles, it may be desirable to shield the transducer 100 (and its electrodes) from the processing liquid so as to avoid shorting and/or contamination of the processing fluid. This can be achieved by bonding a transmitting structure 70 (generically illustrated) to the transducer 100. As illustrated in FIG. 3F, the transmitting structure 70 is bonded directly to the transducer 100. The transmitting structure 70 can be constructed of a wide variety of materials, shapes and dimensions. Depending on the intended function, the transmitting structure can be a rigid structure or a thin film or foil. Suitable materials for the transmitting structure 70 include polymers, quartz, sapphire, boron nitride vitreous carbide, stainless steel, or any other material that can effectively transmit acoustic energy to facilitate the intended processing.

In one embodiment, it may be preferred that the transmitting structure 70 be a polymer film. Suitable polymers include materials like Halar (ECTFE), Polyvinylidene Fluoride (PVDF), Polysulfone or other polymers. The thickness of the polymer film can preferably range from 0.1 mil to 18 mil, and more preferably range from 1 mil to 5 mil. These polymer films may be treated chemically or otherwise manufactured to improve the surface characteristics of the material to provide a low surface tension toward the processing fluid.

Figure 4A:
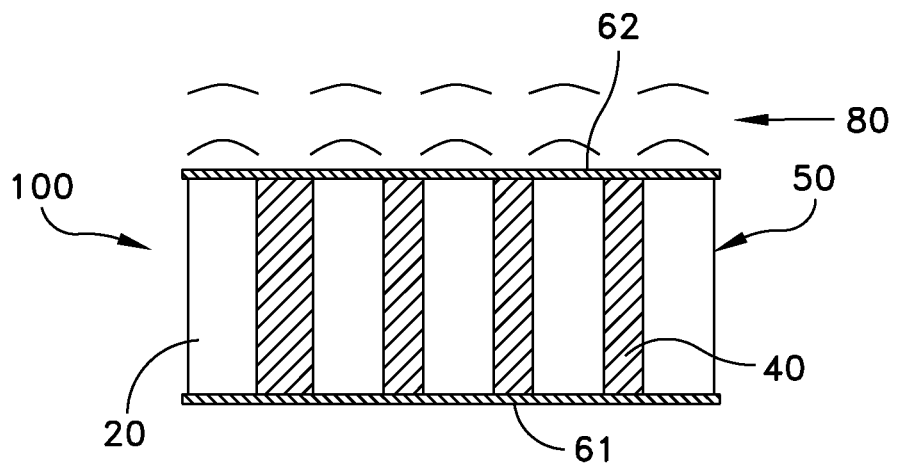
FIG. 4A is a schematic representation of the transducer of FIG. 3F wherein the electrodes are energized so that the individual pillars are generating acoustic energy waves, according to one embodiment of the present invention.

Referring now to FIG. 4A, a schematic representation of the transducer 160 energized so as to generate acoustic energy. Electricity is supplied to the electrodes 61, 62 by wires that are operably connected to a source of electricity. The electricity is converted by each of the piezoelectric pillars 20 into independent acoustic waves 80. As can be seen, the pillars 20 act as independent pistons, each generating its own independent acoustic wave 80 in a direction that is substantially parallel to its height H.

Figure 4B:
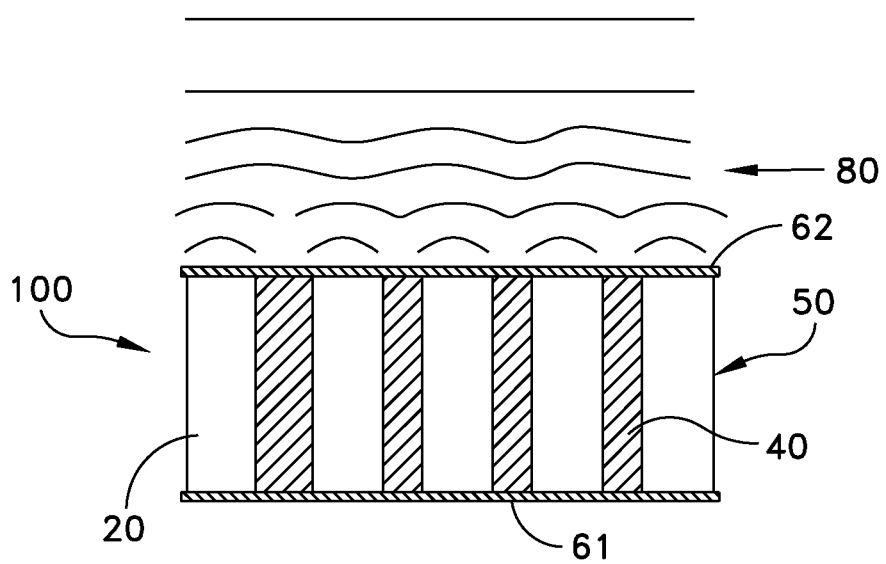
FIG. 4B is a schematic representation of the transducer of FIG. 3F wherein the electrodes are energized so that the individual acoustic energy waves of the pillars effectively combine to form a plane wave profile, according to one embodiment of the present invention.

However, as can be seen in FIG. 4B, the summary effect of the acoustic waves 80 is the launching of a plane wave that is free of nodes of anti-nodes. As the pillars 20 extend in their axial direction (i.e., vertically along their height H) by the piezoelectric effect, the pillars 20 contract by Poisson's ratio in the lateral direct (i.e., horizontally along their width W). Similarly, when the pillars 20 contract in their axial direction by the piezoelectric effect, the pillars 20 expand by Poisson's ratio in the lateral direct. However since the spaces 30 are filled with a resilient material, any waves generated in the lateral direction are greatly dampened or suppressed. This in effect launches the plane wave from the surface of the transducer 100.

As mentioned above, the pillars 20 can be energized independently or grouped in subsets to create acoustically active areas and acoustically inactive areas. Pillars 20 that have no opposing electrodes or do not have their electrodes energized, do not have the piezoelectric effect and do not launch an acoustic wave. Thus the extent of the acoustically active area can be tailored to the precise situation desired. In addition, if areas of the transducer 100 (or assembly in which the device is to be used) are not required to be acoustically active, these sections can have the piezoelectric pillars 20 removed from the composite and filled with a resilient material or left as a void.

Figure 5:
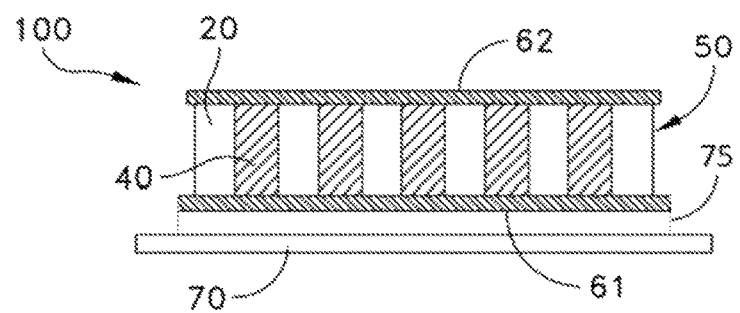
FIG. 5 is a side view of a composite transducer according to one embodiment of the present invention wherein an impedance matching layer has been added.

Referring now to FIG. 5, an embodiment of the transducer 100 is illustrated wherein a matching layer 75 is added between the transmitting structure 70 and the electrode. The matching layer75 (or layers) are preferably chosen to act as impedance matching layers to reduce energy loss during transmission of acoustic energy to the processing fluid. In other words, the matching layer (75) is designed acoustically so that the acoustic wave is efficiently coupled into the transmission fluid and not reflected at the interface. As an example, a ¼ wave epoxy matching layer (Approximately 0.029") and a very thin polymer (Halar film) which is acoustical transparent can be used as the matching layer 75 and the transmitting structure 70 respectively. In design variations, as the external polymer film thickness is increased and is seen as part of the acoustical layers; then the polymer film is included as a matching layer and all layer thickness and properties are adjusted to efficiently transfer the acoustical energy from the piezoelectric pillars 20 to the processing fluid Referring now to FIG. 6, a transducer 100 having a radius of curvature is illustrated according to one embodiment of the present invention. In certain processing applications of articles, it may be desirable for the transducer 100 to take a curved shape to effectuate acoustic energy control and fluid coupling to the article.

The curved transducer 100 of FIG. 6 can be formed by either forming the composite assembly 50 to have a radius of curvature during the steps discussed above or manipulating the composite assembly 50 subsequent to being formed in a flat shape. The electrodes 61, 62 and the transmitting structure 70 (and any matching layers) can be bonded to the composite assembly 50 before or after the curvature is formed. In FIG. 6, these materials were bonded prior to forming the curvature. As an alternate order of construction, the composite assembly 50 alone can be formed in a curved form and then the electrodes 61, 62 and transmitting structure 70 (and impedance matching layers if any) can be bonded in later steps. The transmitter structure 70 is typically included after the curvature forming process and in the next steps of assembly.

The transmitting structure 70 comprises a convex outer surface 71 and a concave inner surface 72. The transducer 100 is bonded to the concave inner surface 71. As can be seen, the top electrodes 62 are applied as two isolated regions on the top surface of the composite assembly 50. Thus, when the transducer is energized by applying an electrical signal to the electrodes 61, 62, only those pillars 20 covered by the electrodes 62 will generate acoustic energy, thereby resulting in two separate acoustically active regions A, B. Because the central region of the composite assembly 50 does not receive an electric signal as a result of there being no electrode 62 in that region, the pillars 20 in that region do not generate acoustic energy, thereby resulting in an acoustically inactive area C. The acoustically active regions A, B are circumferentially separated by the acoustically inactive area C.

The pattern of the electrodes 61, 62 to create the active piezoelectric pillars 20 can be varied to change the acoustical energy pattern to any desired configuration. Reduced electrode pattern area can also reduce the effective acoustical strength in a given area. In addition, areas of the composite assembly 50 where no acoustical energy is required may be made inactive by not only omitting electrodes in that area, but also may have electrodes that do not receive power, or these areas can have the composite assembly 50 removed and/or left as void or replaced with a resilient material. In alternate embodiments, the piezoelectric pillars 20 can be grouped, and each group would have its own electrode(s) 61, 62 and power/control wire. This would allow each group of pillars 20 to be controlled independently by an outside controller. This allows for each group of pillars to have its own power level, operating frequency, on/off cycle time. In other embodiments, the outer electrode can be divided into multiple regions. Each electrode would have its own power/control wire. This is an alternate method to control the active region(s) of the device.

Figure 7:
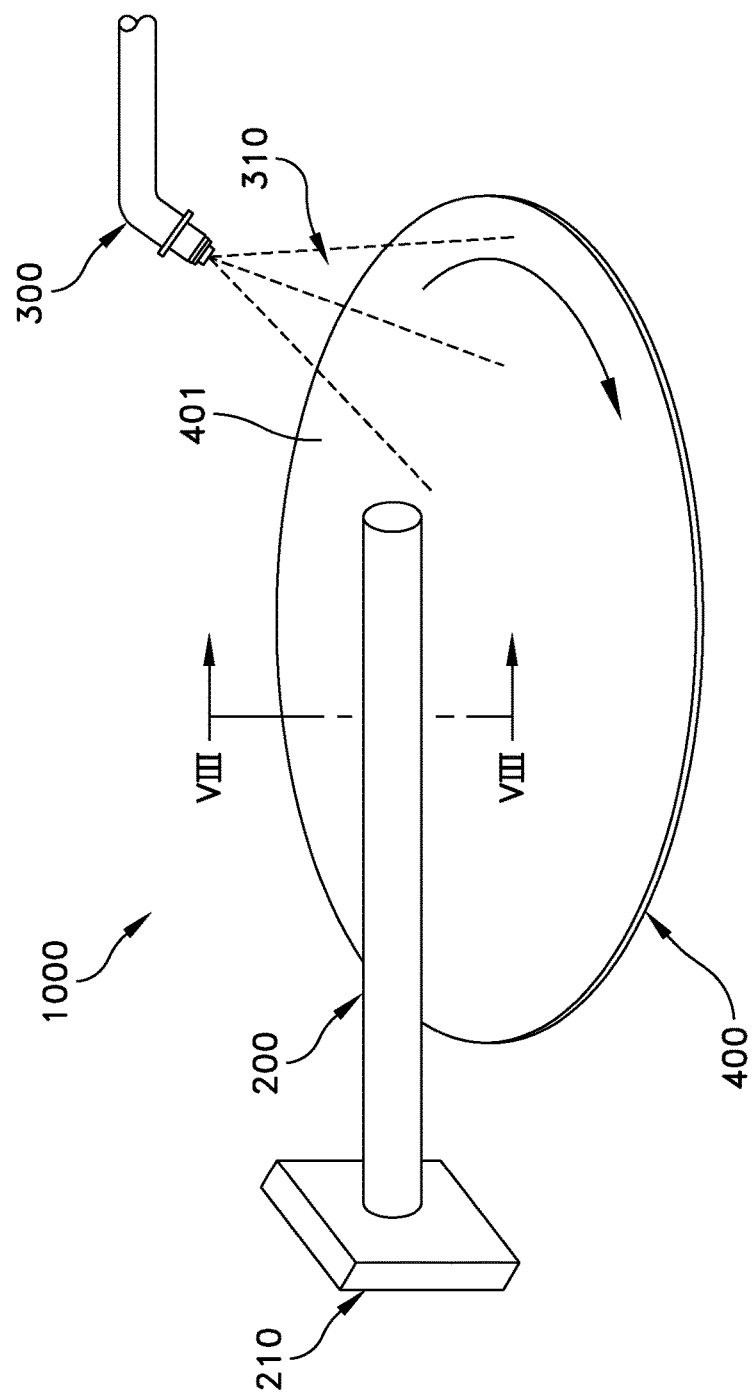
FIG. 7 is a perspective view of an acoustic processing system according to one embodiment of the present invention.

Referring now to FIG. 7, a megasonic system 1000 for processing a flat article 400 is illustrated. The megasonic system 1000 comprises a rotary support (not visible) upon which the article is supported in a generally horizontal orientation and rotated. The megasonic system 1000 also comprises a transducer assembly 200 that is positioned adjacent to and opposing an upper surface 401 of the article 400. The transducer assembly 200 is supported in a cantilevered fashion by the support mechanism, generically illustrated at block 210. If desired, the support mechanism can be capable of translational and/or pivotal movement. The transducer assembly 200 is supported sufficiently close to the surface 401 of the article so that when the dispenser 300 applies a liquid to the surface of the wafer, a liquid film of the liquid couples the transducer assembly 200 to the surface 401 so that acoustic energy generated by the transducer assembly 200 can be transmitted to the article 400. The general concept of such single-article acoustic-assisted processing systems are known in the art and disclosed in such patents at U.S. Pat. No. 6,684,891, to Mario Bran, the entirety of which is incorporated by reference.

The transducer assembly 200 is supported substantially parallel to the surface 401 of the article 400. While the transducer assembly 200 is illustrated as an elongated rod-like probe, the invention is not so limited. It is to be understood that the transducer assembly can take on a wide variety of shapes, orientations, and structural arrangements.

Figure 8:
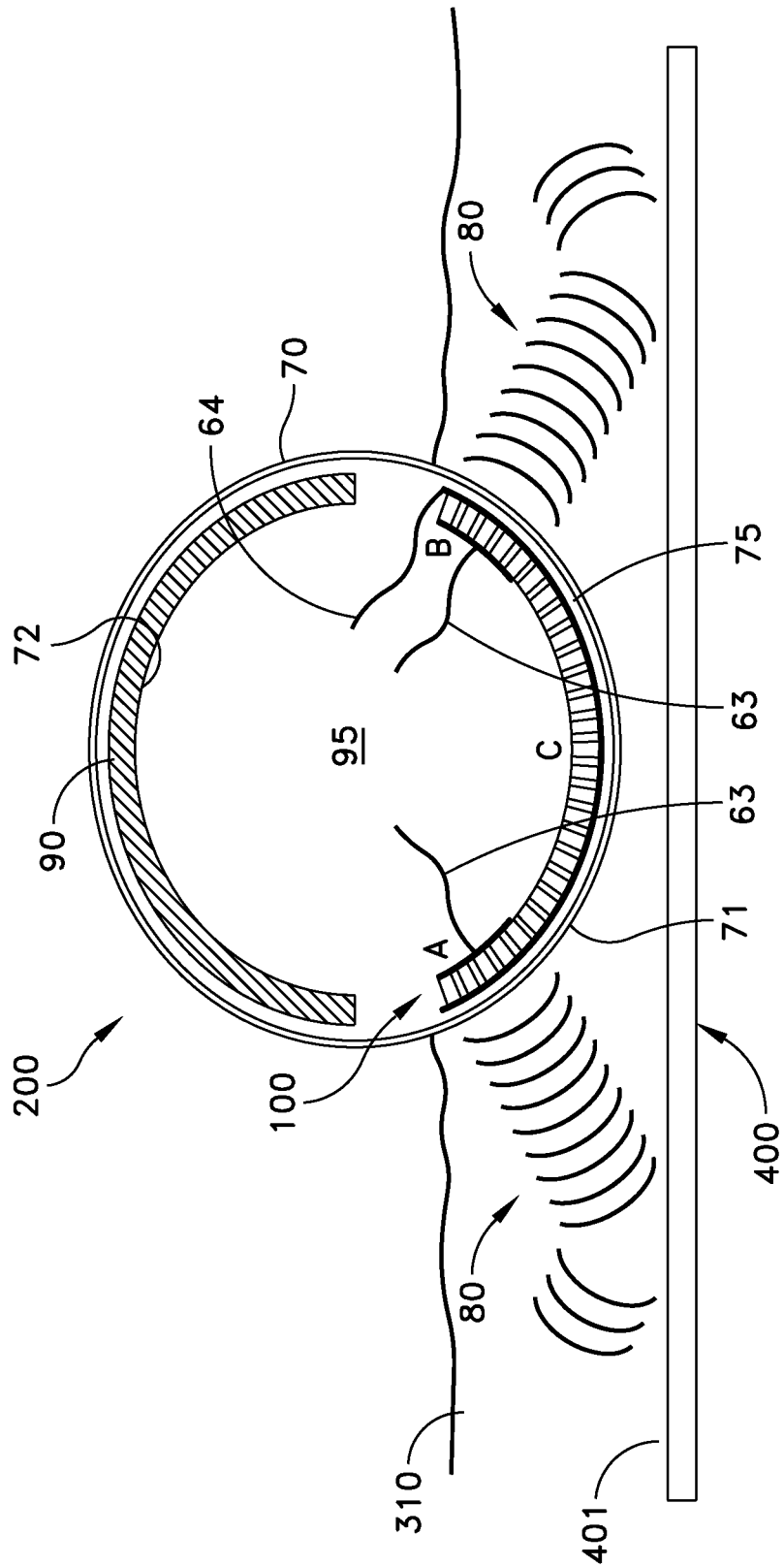
FIG. 8 is a cross-sectional view of the transducer assembly of the acoustic processing system of FIG. 7 along perspective VIII-VIII.

Referring now to FIG. 8, a cross-sectional view of the transducer assembly 200 is illustrated. The transducer assembly 200 incorporates the curved transducer described in FIG. 6 above except that a impedance matching layer 75 has been incorporated and the transmitting structure 70 is in the shape of a tubular element. In this embodiment, the transmitting structure 70 is a protective polymer film extended over a supporting structure 90 that plays no role acoustically in the device, but supplies rigidity and structural integrity. In an alternative embodiment, the transmitting structure 70 can be constructed of a material and/or thickness that is sufficiently rigid to provide the necessary structural integrity for supporting. For example, the transmitting structure 70 can be constructed of quartz, sapphire, fused silica, or other materials that are inert to the chemicals and/or liquid used in the processes.

The transmitting structure 70 is the form of a cylindrical tube and comprises an outer surface 71 and inner surface 72. Of course, the transmitting structure 70 can take other curved embodiments, such as a lens, a curved plate, a par-cylindrical trough, etc.

Electrical wires 63, 64 are operably connected to the electrodes 61, 62 and routed through the transducer assembly 200 to the outside where they are connected to a source of an electrical signal. The source of electricity provides an electrical signal that drives the piezoelectric pillars 20 located in the active areas A, B of the composite transducer 100 to generate waves 80 of acoustic energy. Preferably, the wave 80 of acoustic energy have a frequency that is in the megasonic range, and more preferably between 500 KHz and 5 MHz.

The composite transducer 100 is bonded to the inner surface 71 of the transmitting structure 70 at the bottom circumferential portion so that the waves 80 of acoustic energy generated by the acoustically active sections A, B of the composite transducer 100 are transmitted into the layer of liquid 310 on the article surface 401. Through a combination of the rotational orientation of the transducer assembly 200 and the circumferential spacing between the acoustically active sections A, B of the piezoelectric pillars 20, the plane waves 80 of acoustic energy are transmitted through the liquid layer 310 to the surface 401 of the article 400 at an angle so that the waves 80 do not reflect back into the transducer assembly 200. Instead, the waves 80 reflect off the article 400 and angle harmlessly away from the transducer assembly 200.

In other words, by having only those pillars 20 on the two upper edges electrically active, acoustic waves launched from these pillars 20 do not reflect back to the transducer 100, thereby suppressing standing waves. The pillars 20 that would generate a standing wave (those in acoustically inactive region C) are not electrically connected with electrodes.

The transmitting structure 70 forms an internal cavity 95, may be left as a void filled with air or another gas, or optionally may be filled with a dampening material which dampens acoustic energy that may be applied to the backside of the transducer 100 inside of this construction. The presence of a dampening material suppresses any undesirable acoustical energy. The transmitting structure 70 is sealed such that the liquid 310 cannot breach the cavity 95 and the material inside of the cavity 95 cannot get outside to contaminate the liquid 310 and potentially the article, which may be a semiconductor wafer or solar panel having delicate structures.

It may also be desirable to have the outer surface of the transmitting structure 70 treated or altered to have a low surface tension toward the transmission liquid 310 so at least partial wetting occurs. Air pockets, bubbles or voids will cause reflections of acoustical energy back to the transducer.

Referring to FIGS. 7 and 8 concurrently, a method of cleaning a semiconductor wafer 400 using the system 1000 will be described. First, a semiconductor wafer 400 is positioned on the rotatable support where it is supported in a generally horizontal orientation. The wafer 400 is then rotated, as indicated by the arrow. A liquid medium 310 is then dispensed via the dispenser 300 onto the top surface 401 of the wafer 400. The liquid can be any chemical, solution or the like used in processing wafers, such as DI water, SC1, SC2 ozonated DI water, etc.

The transducer assembly 200 is positioned adjacent the surface 401 of the wafer so that a small gap exists between the bottom of the transmitting structure 70 and the surface 401 of the wafer 400. The transducer assembly is just larger than a radius of the wafer 400. For example, for a 300 mm silicon wafers, the transducer assembly 200 would be rod like 240 mm long rod with 150 mm of active acoustical length.

As the wafer 400 rotates, the liquid 310 supplied to the surface 401 forms a layer of liquid 310 that fluidly couples the transducer assembly 200 to the wafer 400. Electricity is then supplied via the wires, 63, 64 to excite the pillars 20 in the active regions A, B, thereby generating acoustic energy waves 80 at the desired frequency and power level. The waves 80 of acoustic energy are then transmitted outward through the transducer assembly 200 in an angled manner and enter the liquid layer 310, eventually contacting the wafer surface 401. Rotating the wafer 400 on the chuck beneath the transducer assembly 200 provides complete acoustic coverage of the surface 401. The acoustic energy waves 80 dislodge particles from the wafer surface 401, thereby effectuating cleaning.

Figure 9:
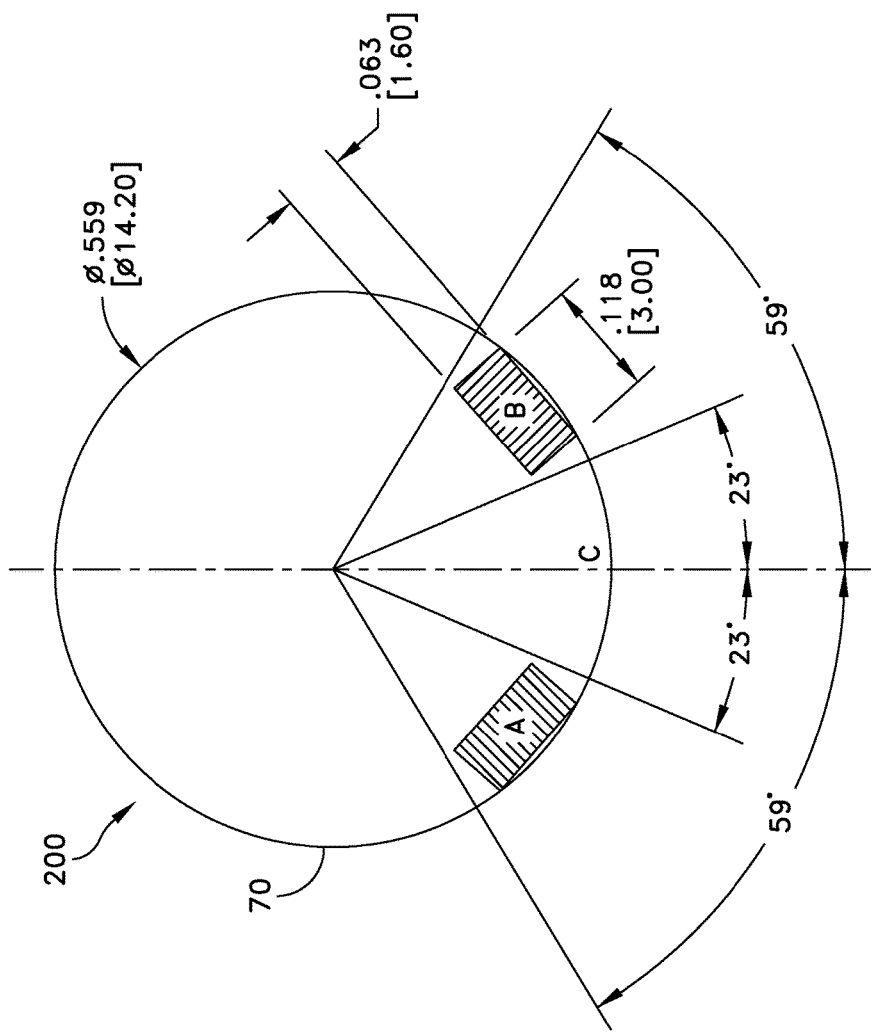
FIG. 9 is a diagram of the transducer assembly of FIG. 8 showing one set of preferred dimensions.

As shown in FIG. 9, the acoustically active areas A, B are separated by an acoustically inactive area C of at least 45 degrees or more. This ensures that the waves 80 do not reflect back into the transducer assembly 200. Of course, the size of the inactive area C will be dictated by the curvature of the structure and other characteristics. Furthermore, while the inner and outer surfaces 71, 72 of the transmitting structure 70 are shown as curved surfaces, it is possible that the angled wave application technique of the present invention can be accomplished by using planar surfaces that are angled to one another. Thus, the terms curved, convex, and concave are intended to cover embodiments wherein planar surface are angularly oriented with respect to one another to achieve the same effect.

Figure 10:
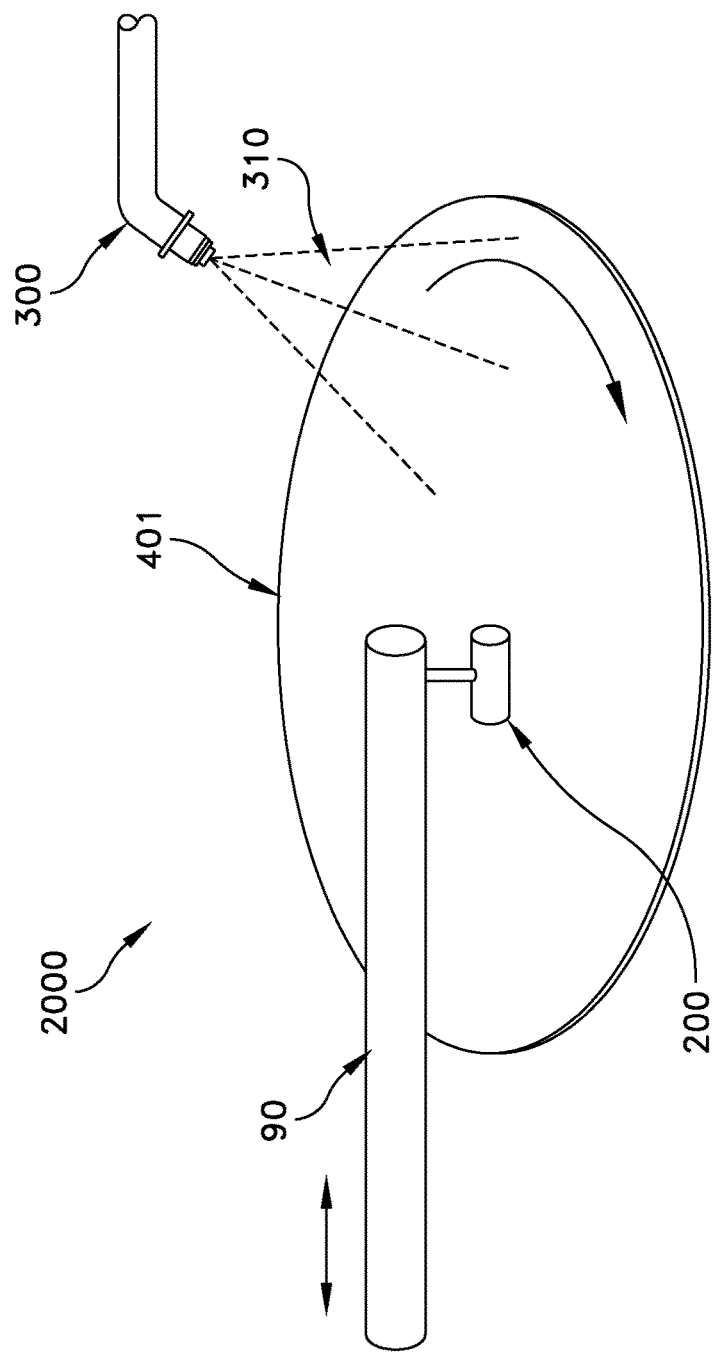
FIG. 10 is a perspective view of an acoustic processing system according to a second embodiment of the present invention wherein a small composite transducer assembly is moved across the surface of a wafer by a support rod.

Referring now to FIG. 10, a second embodiment of a system 2000 according to the present invention is illustrated. In this embodiment, the composite transducer assembly 200 is a short segment of the transducer assembly of the first system 1000. This short segment transducer 200 is attached to a support arm 90 that traverses the rotating chuck in a radial manner. The radial scan can be programmed to account for the area of the wafer increasing as the transducer moves toward the outer edge. The acoustical transmission media 310 would be dispensed onto the wafer surface 401 as set forth above to achieve the fluid coupling. The acoustical device 200 would be rod like 24 mm long with 20 mm of active acoustical length.

Figure 11:
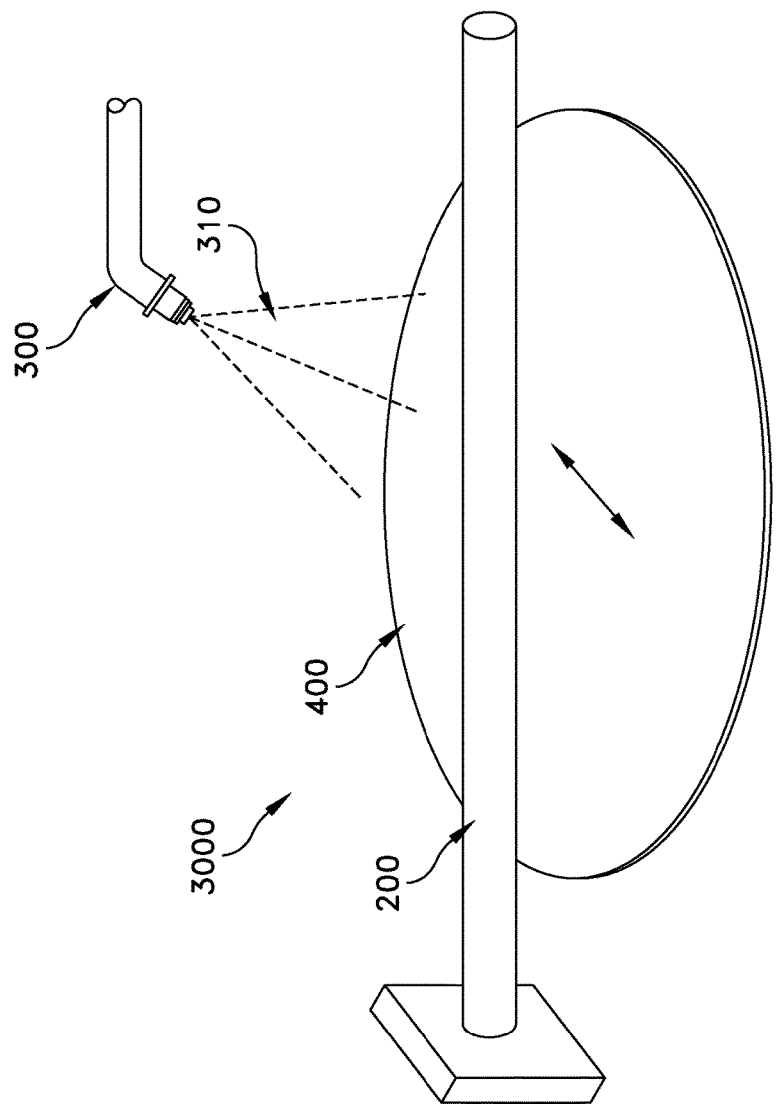
FIG. 11 is a perspective view of an acoustic processing system according to a third embodiment of the present invention wherein a composite transducer assembly extends across the entire diameter of a wafer.
Figure 12:
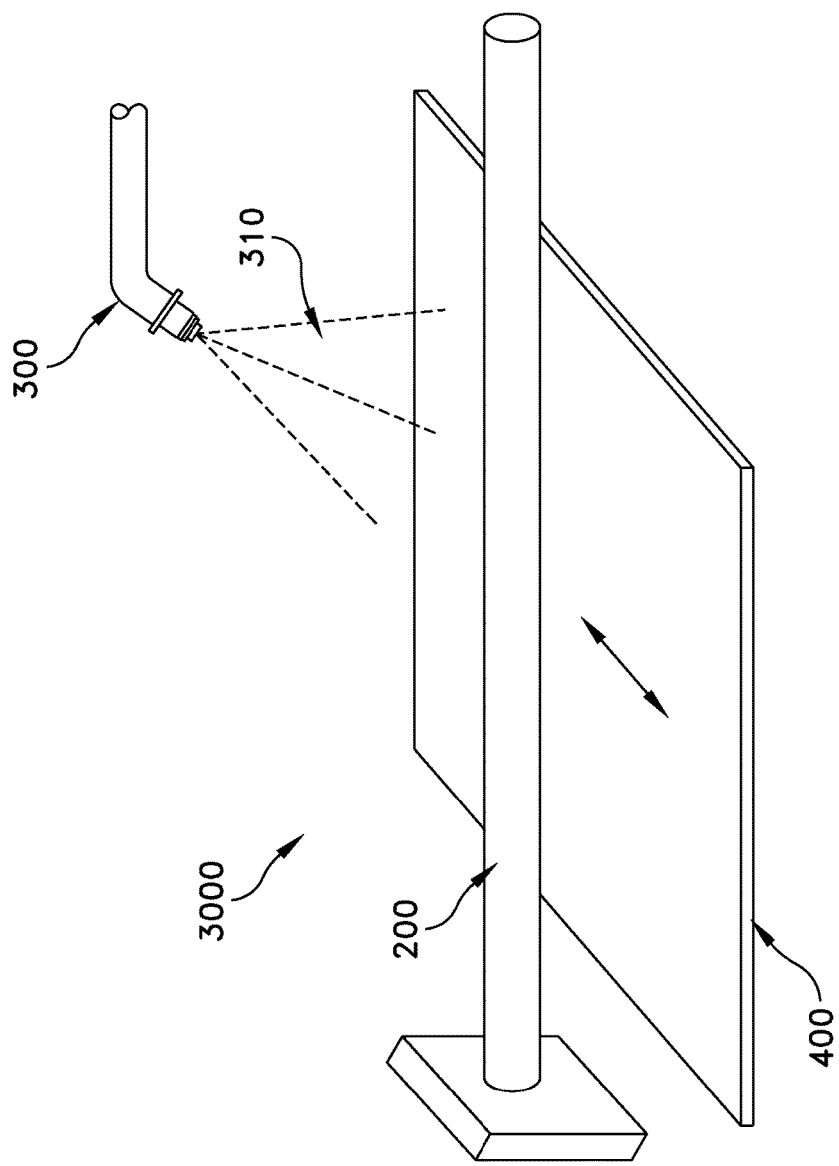
FIG. 12 is a perspective view of the acoustic processing system of FIG. 11 processing a rectangular panel.

Referring now to FIGS. 11-12, a third embodiment of a system 3000 according to the present invention is illustrated processing articles of different shape. In this embodiment, the composite transducer 200 is a full diameter (or width) of the object 400 to be treated. The transducer 200 could be held in place and the object (wafer, plate etc.) could be linearly scanned beneath the transducer 200. The acoustical transmission media would be dispensed onto the wafer/plate surface.

Figure 13:
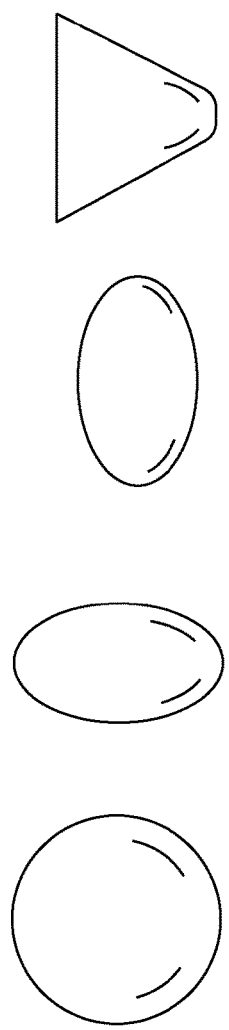
FIG. 13 is an illustration of different shapes in which a curved composite transducer according to the present invention can be constructed.
Figure 14:
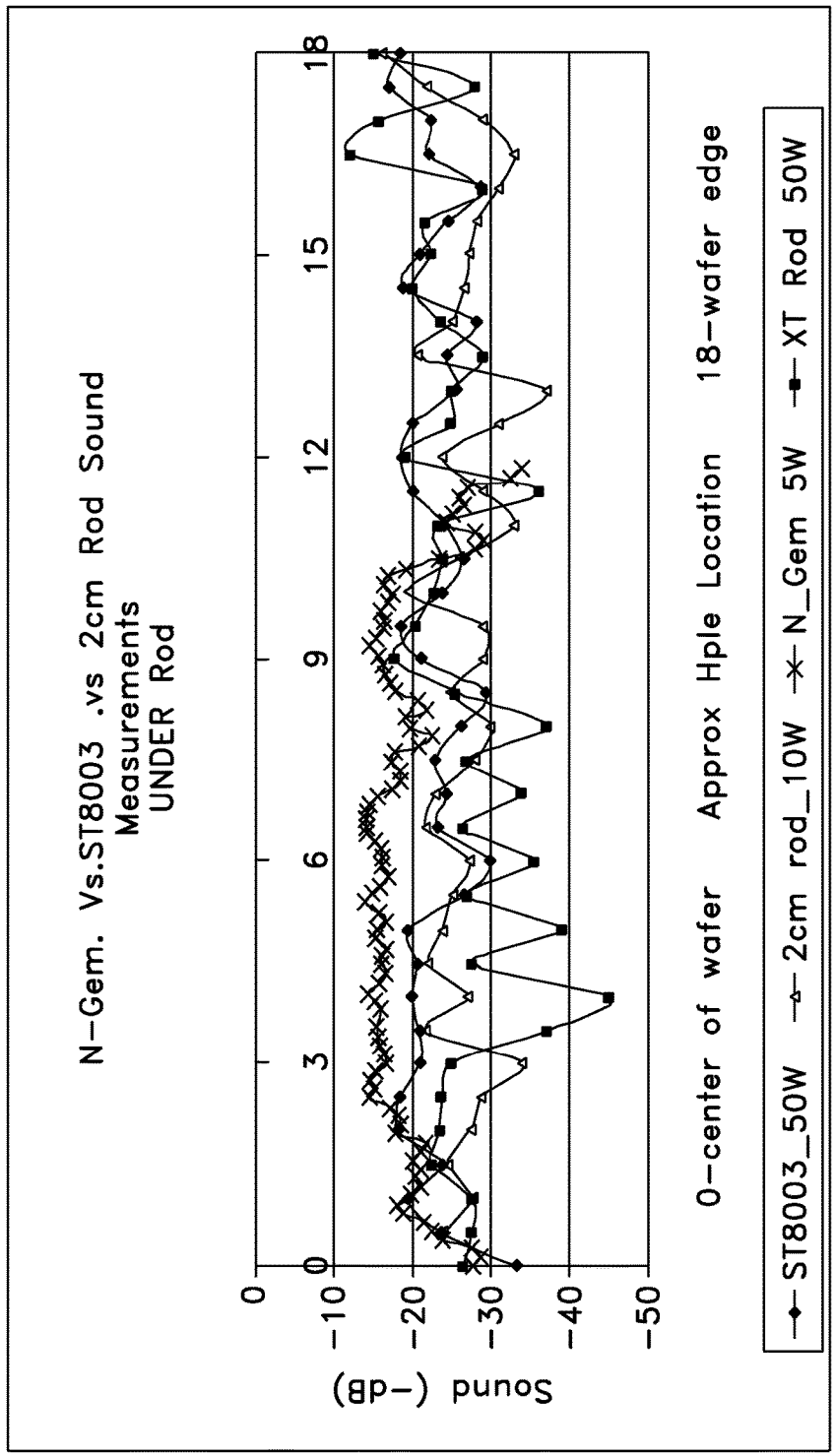
FIG. 14 is a graph comparing acoustic levels generated at various distances along a wafer for a transducer assembly according to the present invention and three prior art transducer configurations.

In each instance the desired goal is to suppress structure damage from the acoustic energy applied to the surface, yet having sufficient energy to remove particles. Using composite piezoelectric material, it is also possible to make a transducer that is made up of many segments (extending the composite pattern) so that the length can be any dimension in principal. Furthermore, the general shape is not required to be a round rod, alternative variations in the shape of the device can enhance the characteristics of the device, as shown in FIG. 13.

The foregoing description of the preferred embodiment of the invention has been presented for the purpose of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of processing an article comprising:
   supporting an article on a support;
   providing a transducer assembly comprising:
   a transmitting structure having a convex outer surface and a concave inner surface that defines an internal cavity; and
   a transducer bonded to the inner surface of the transmitting structure, the transducer comprising:
   a plurality of pillars constructed of a piezoelectric material, the pillars arranged in a spaced-apart manner so that spaces exist between adjacent pillars, the spaces filled with a resilient material so as to form a composite assembly having a first surface and a second surface;
   a first electrode coupled to the first surface of the composite assembly;
   a second electrode coupled to a first portion of the second surface of the composite assembly and a third electrode coupled to a second portion of the second surface of the composite assembly, the second and third electrodes spaced apart from one another by a third portion of the second surface of the composite assembly so that at least one of the plurality of pillars is exposed at the second surface of the composite assembly;
   wherein the convex outer surface of the transmitting structure comprises:
   a first acoustically active area when the first and second electrodes are energized, the first acoustically active area being aligned with the first portion of the second surface of the composite assembly;
   a second acoustically active area when the first and third electrodes are energized, the second acoustically active area being aligned with the second portion of the second surface of the composite assembly; and
   an acoustically inactive area between the first and second acoustically active areas, the acoustically inactive area being aligned with the third portion of the second surface of the composite assembly;
   positioning the transducer assembly adjacent to and opposing a surface of the article on the support;
   applying fluid to the surface of the article so that the first and second acoustically active areas are fluidly coupled to the surface of the article; and
   activating the first, second and third electrodes, thereby generating acoustic waves that are propagated at the surface of the article at a non-normal angle that results in reflected acoustic waves travelling away from the transducer assembly.

2. The method of claim 1 wherein the pillars have a width and a height extending between the first and second surfaces of the composite assembly, wherein the height of the pillars is greater than the width of the pillars.

3. The method of claim 2 wherein the support is capable of rotation or translation of the article.

4. The method of claim 3 further comprising orienting the transducer assembly so that the acoustically inactive area of the convex outer surface faces the surface of the article and is closer to the surface of the article than the first and second acoustically active areas of the transmitting structure.

5. The method of claim 4 wherein the first and second acoustically active areas on the convex outer surface of the transmitting structure are spaced apart from one another by at least 45 degrees of the concave inner surface of the transmitting structure.

6. The method of claim 1 further comprising an impedance matching layer located between the concave inner surface of the transmitting structure and the first electrode.

7. The method of claim 1 wherein the support is capable of rotation or translation of the article.

8. The method of claim 1 further comprising orienting the transducer assembly so that the acoustically inactive area of the convex outer surface faces the surface of the article and is closer to the surface of the article than the first and second acoustically active areas of the transmitting structure.

9. The method of claim 1 wherein the first and second acoustically active areas are spaced apart from one another by at least 45 degrees of the concave inner surface.

10. The method of claim 1 wherein the first surface of the composite assembly is convex and the second surface of the convex assembly is concave, the first surface of the composite assembly being adjacent to the inner surface of the transmitting structure.

11. An apparatus for processing articles with acoustic energy comprising:

a support for supporting an article to be processed;
a conduit for applying a fluid to a surface of the article; and
a transducer assembly comprising:
- a transmitting structure having a convex outer surface and a concave inner surface that defines an internal cavity; and
- a transducer positioned within the internal cavity of the transmitting structure, the transducer comprising:
  - a plurality of pillars constructed of a piezoelectric material, the pillars arranged in a spaced-apart manner so that spaces exist between adjacent pillars, the spaces filled with a resilient material so as to form a composite assembly having a first surface and a second surface;
  - a first electrode coupled to the first surface of the composite assembly; and
  - a second electrode coupled to a first portion of the second surface of the composite assembly and a third electrode coupled to a second portion of the second surface of the composite assembly, the second and third electrodes spaced apart from one another by a third portion of the second surface of the composite assembly so that at least one of the plurality of pillars remains uncovered by the second and third electrodes at the second surface of the composite assembly;

wherein a first portion of the first electrode is aligned with the second electrode to form a first acoustically active area on the convex outer surface of the transmitting structure when the first and second electrodes are energized;

wherein a second portion of the first electrode is aligned with the third electrode to form a second acoustically active area on the convex outer surface of the transmitting structure when the first and third electrodes are energized;

wherein an acoustically inactive area exists on a portion of the convex outer surface of the transmitting structure that is aligned with the third portion of the top surface of the composite assembly; and the transducer assembly positioned adjacent to and opposing the surface of the article so that when the fluid is applied to the surface of the article by the conduit, the first and second acoustic transducers are acoustically coupled to the surface of the article.

12. The apparatus of claim 11 wherein the support is a rotatable support.

13. The apparatus of claim 6 wherein the transducer assembly is oriented so that acoustic waves generated by the first and second acoustically active areas are propagated at the surface of the article at a non-normal angle that results in reflected acoustic waves traveling away from the transducer assembly.

14. The apparatus of claim 11 wherein the pillars have a width and a height extending between the first surface and the second surface of the composite assembly, wherein the height of the pillars is greater than the width of the pillars.

15. A transducer assembly comprising:
a transmitting structure having a convex outer surface and a concave inner surface that defines an internal cavity; and
a transducer bonded to the inner surface of the transmitting structure, the transducer comprising:
- a plurality of pillars constructed of a piezoelectric material, the pillars arranged in a spaced-apart manner so that spaces exist between adjacent pillars, the spaces filled with a resilient material so as to form a composite assembly having a first surface formed by first surfaces of the plurality of pillars and the resilient material and a second surface formed by second surfaces of the plurality of pillars and the resilient material;
- a first electrode coupled to the first surface of the composite assembly; and
- a second electrode coupled to a first portion of the second surface of the composite assembly and a third electrode coupled to a second portion of the second surface of the composite assembly, the second and third electrodes spaced apart from one another by a third portion of the second surface of the composite assembly so that the second surface of at least one of the plurality of pillars is uncovered by either of the second and third electrodes;

wherein a first portion of the first electrode is aligned with the second electrode to form a first acoustically active area on the convex outer surface of the transmitting structure when the first and second electrodes are energized;

wherein a second portion of the first electrode is aligned with the third electrode to form a second acoustically active area on the convex outer surface of the transmitting structure when the first and third electrodes are energized; and wherein an acoustically inactive area exists on a portion of the convex outer surface of the transmitting structure that is aligned with the third portion of the second surface of the composite assembly.

* * * * *